(12) United States Patent
de Vries (10) Patent No.: US 10,340,859 B2
(45) Date of Patent: Jul. 2, 2019

(54) CLASS-D POWER AMPLIFIER NESTED INSIDE LOW-NOISE DIFFERENTIAL OP-AMP FEEDBACK LOOP

(71) Applicant: Tymphany HK Limited, Wan Chai (HK)

(72) Inventor: Sebastiaan de Vries, Shenzhen (CN)

(73) Assignee: Tymphany HK Limited, Wan Chai (HK)

( * ) Notice: Subject to any disclaimer, the term of this patent is extended or adjusted under 35 U.S.C. 154(b) by 0 days.

(21) Appl. No.: 15/812,733

(22) Filed: Nov. 14, 2017

(65) Prior Publication Data

US 2018/0138865 A1    May 17, 2018

Related U.S. Application Data

(60) Provisional application No. 62/421,675, filed on Nov. 14, 2016.

(51) Int. Cl.
| | | |
|---|---|---|
| *H03F 3/217* | (2006.01) | |
| *H03F 1/26* | (2006.01) | |
| *H03F 3/45* | (2006.01) | |
| *H03F 3/187* | (2006.01) | |
| *H03F 1/32* | (2006.01) | |

(52) U.S. Cl.
CPC ............ *H03F 1/26* (2013.01); *H03F 1/3211* (2013.01); *H03F 3/187* (2013.01); *H03F 3/2175* (2013.01); *H03F 3/45475* (2013.01); *H03F 2200/03* (2013.01); *H03F 2200/135* (2013.01); *H03F 2200/411* (2013.01); *H03F 2203/45051* (2013.01); *H03F 2203/45116* (2013.01)

(58) Field of Classification Search
CPC ............................... H03F 3/217; H03F 3/2171
USPC ............................................. 330/207 A, 251
See application file for complete search history.

(56) References Cited

U.S. PATENT DOCUMENTS

| | | | | |
|---|---|---|---|---|
| 8,866,544 B2 * | 10/2014 | Llewellyn | ............... | H03F 3/217 330/10 |
| 2006/0001488 A1 * | 1/2006 | Ryoo | ..................... | H03F 1/086 330/251 |

* cited by examiner

*Primary Examiner* — Steven J Mottola
(74) *Attorney, Agent, or Firm* — Muncy, Giessler, Olds & Lowe, P.C.

(57) ABSTRACT

An amplifier system includes a Class-D power amplifier integrated circuit (IC) that is nested inside a feedback loop of a low noise differential operational amplifier (op-amp).

16 Claims, 13 Drawing Sheets

CLASS-D POWER AMPLIFIER NESTED INSIDE LOW-NOISE DIFFERENTIAL OP-AMP FEEDBACK LOOP

CROSS REFERENCE TO RELATED APPLICATIONS

This application claims priority of U.S. Provisional Application No. 62/421,675 filed on Nov. 14, 2016 under 35 U.S.C. § 119(e), the entire contents of all of which are hereby incorporated by reference.

FIELD OF THE INVENTION

The present invention relates to power amplifiers, and more specifically, to Class-D power amplifiers.

BACKGROUND OF THE INVENTION

Typical power amplifier systems known in the art include output inductors in series with the output stage and cause output inductor distortion as well as output impedance (referred to as DCR or DC Resistance). As a consequence of this output impedance causing added distortion and a reduced damping-factor (the ability to control the moving mass of the loudspeaker drivers of a loudspeaker system) the audio signal will suffer.

Class-D amplifier Integrated Circuit's (IC's) have relative high resistor values inside integrated-circuit packages. This is because of a limitation of the silicon material and its inability to handle the thermal effect of having high currents passed through internal resistors with low ohmic values. Furthermore, general distortion (referred as Total harmonic distortion) is evident in Class-D amplifier IC's as well as Class-D amplifiers and is, in general, caused by the Class-D amplifiers switching nature. In other words switching output-stages adds distortion that modulates down into the audio band.

SUMMARY OF THE INVENTION

According to an example of the present invention, an amplifier system may include a power amplifier integrated circuit (IC) that may be nested inside a feedback loop of a low noise differential operational amplifier (op-amp). The power amplifier may be a Class-D power amplifier.

The problems of the prior art can be solved by means of the present invention; in particular using nested feedback solves the problems because the point at which feedback is taken is located at a point in the system after the output inductors. By nesting an amplifier IC inside the feedback-loop of a differential amplifier, low ohmic resistor values can be chosen for the feedback resistors, which reduces Johnson noise, electronic noise generated by thermal agitation of charge carriers, significantly. Furthermore, by nesting a Class-D amplifier IC inside a feedback-loop of a differential op-amp, distortions will be seen as an "error" by differential op-amp and be corrected in opposite phase providing a considerable improvement over the conventional amplifier.

The present invention's implementation of the differential op-amp is also unique and provides the benefits that the feedback signal can be routed differentially as a magnetically coupled pair at the PCB level without reference to a ground connection. This provides the cleanest feedback path with minimised magnetic interference and this clean feedback path provides further reduction in total harmonic distortion allowing the PCB layout to be executed as simply as possible.

In an embodiment, the power amplifier integrated circuit is connected to an output, preferably via at least one inductor.

In an embodiment, the one or more feedback loops includes one or more first feedback loops with one or more first connections electrically coupled to the one or more outputs of the power amplifier integrated circuit and one or more second connections electrically coupled to the one or more outputs of the differential operational amplifier.

In an embodiment, the one or more feedback loops includes one or more second feedback loops with one or more first connections electrically coupled to the one or more outputs of the power amplifier integrated circuit and one or more second connections electrically coupled to the one or more inputs of the differential operational amplifier.

In an embodiment, the amplifier system comprises a current drive circuit, preferably connected between the differential operational amplifier and an input. In an embodiment, the current drive circuit comprises at least one amplifier stage, preferably connected directly or indirectly to a second amplifier stage. In an embodiment, at least one stage of the current drive circuit is connected between an input and the differential operational amplifier. The current drive circuit may preferably include one or more current drive feedback circuits, for example including one or more first connections electrically coupled to the one or more outputs of the second amplifier stage and one or more second connections electrically coupled to the one or more inputs of the first amplifier stage.

In an embodiment, at least one amplifier stage is an operational amplifier stage, preferably the first amplifier stage, and/or at least one amplifier stage is a diamond buffer stage, preferably the second amplifier stage.

In an embodiment, the differential operational amplifier and the one or more feedback loops are driven by a digital to analogue converter integrated circuit, for example a multichannel digital to analogue converter integrated circuit.

In an embodiment, one or more operational amplifier integrated circuits are used in the input stage to further reduce noise.

Additional features are realised through the techniques of the present invention. Other examples are described in detail herein and are considered a part of the claimed invention. For a better understanding of the invention with the features, refer to the description and to the drawings.

BRIEF DESCRIPTION OF THE DRAWINGS

Various embodiments of the invention will in the following be described with reference to the drawings where.

DETAILED DESCRIPTION OF THE EXEMPLARY EMBODIMENTS

Various non-limiting embodiments provide a power amplifier integrated circuit (IC) that is nested inside a feedback loop of a low noise differential operational amplifier (op-amp); where the power amplifier may be a Class-D power amplifier. By nesting a Class-D IC inside the loop of a low noise differential op-amp the total harmonic distortion plus noise (THD+N), direct current (DC) precision and noise performance is mainly dictated by the differential op-amp. Since the Class-D IC may be controlled by a driving differential op-amp which is physically a separated IC, non-linearity and distortion caused by thermal changes which normally appear in the audio band of conventional amplifier circuits can be eliminated. Additionally, to maintain low noise caused by thermal fluctuations (i.e., low Johnson noise) over the audio band, resistor values are set extraordinary low. In at least one example, another nested feedback input stage, within a current drive circuit, with a diamond buffer may be employed to drive the low input impedance of the circuit. The amplifier system 100 can be employed in various applications including, but not limited to, hi-fidelity (Hi-Fi) stereo systems, active studio monitor, sound-bar components, wireless speaker systems, surround sound systems, home theatre systems, and television sets.

Figure 1:
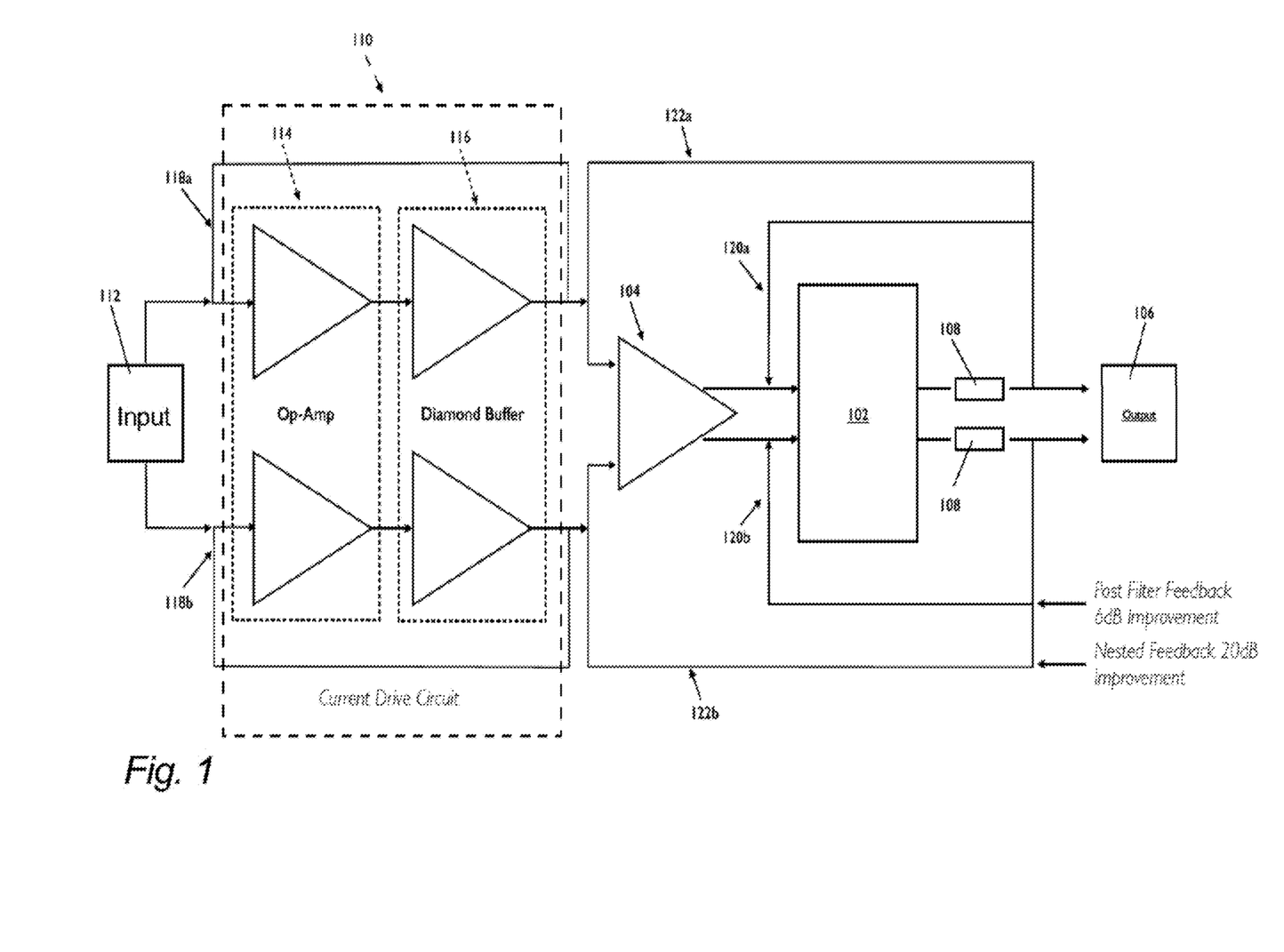
FIG. 1 is a block diagram of an amplifier system including a Class-D power amplifier integrated circuit (IC) that is nested inside a feedback loop of a low noise differential operational amplifier (op-amp) according to a non-limiting example.

Turning now to FIG. 1, an amplifier system 100 including a power amplifier IC 102, which may be a Class-D power amplifier, that is nested inside a feedback loop of a low noise differential op-amp 104, is illustrated according to a non-limiting example. The term nested may be understood to mean the power amplifier IC may be embedded, integrated or contained within the feedback loop of the differential op-amp 104. In at least one example, the power amplifier IC 102 may be connected to an output 106 such as an acoustic speaker, for example, via one or more inductors 108.

The amplifier system 100 may further include a current drive circuit 110 which may be interconnected between the differential op-amp 104 and an input 112. The current drive circuit 110 may include at least one amplifier stage. As seen in FIG. 1 the current drive circuit 110 may include a first amplifier stage 114 such as an op-amp stage 114, for example, and a second amplifier stage 116 may be connected to the output of the first amplifier stage 114. The current drive circuit 110 may further include one or more feedback circuits 118 (e.g. 118a, 118b). The feedback circuit 118 may include one or more first connections electrically coupled to the one or more output(s) of the second amplifier stage 116 and one or more second connections electrically coupled to the one or more input(s) of the first op-amp stage 114. In at least one example, the second amplifier stage 116 may be a diamond buffer stage 116. The inclusion of the current drive circuit 110 is not essential for the functioning of the amplifier system 100. However, if the current drive circuit is employed in this manner, the diamond buffer stage 116 can drive a decreased input impedance of the differential op-amp 104, e.g. in an embodiment around 100Ω, because feedback-resisters from the output of the power amplifier IC 102 to the input of the differential op-amp 104 are very low values to reduce the Johnson-Noise. This allows the use of low resistance values of the feedback loop. In turn, this reduces the system noise to very low-noise level by driving a low impedance load. This low impedance load may be low impedance resistor networks in at least one of the feedback loops described below. The diamond buffer stage 116 can drive the low input impedance and is designed to have high output current capability. In some examples, the diamond buffer stage 116 may be swapped as a front end drive stage and moved to be placed between the power amplifier IC 102 and the output 106.

As further illustrated in FIG. 1, the amplifier system 100 may include one or more first feedback loops 120 (e.g. 120a, 120b) and/or one or more second feedback loops 122 (e.g. 122a, 122b). The first feedback loop 120 may have a first connection electrically coupled to the output(s) of the power amplifier IC 102 and a second connection electrically coupled to output(s) of the differential op-amp 104. The second feedback loop 122 may have a first connection electrically coupled to the output power amplifier IC 102 and the first connection, and a second connection electrically coupled to the input(s) of the differential op-amp 104. These one or more first and/or second feedback loops provide the advantages that the post filter feedback produces a 6 dB improvement and the nested feedback produces a 20 dB improvement in reducing the noise of the amplifier system 100, as can be seen in FIG. 1. There may be multiple differential op-amples 104 in a parallel configuration to achieve the same high current output capability from one diamond buffer.

The below Table 1 compares the performance characteristics of a conventional Class-D amplifier to an amplifier system 100 including a Class-D power amplifier IC 102 that is nested inside a feedback loop of a low noise differential op-amp 104 according to a non-limiting example.

TABLE 1

|  | Conventional Amp | Class-D Amp w/ Nested Feedback |
|---|---|---|
| THD + N 15 Watt @ 4Ω 1 kHz | 0.013% | 0.0013% |
| Output Noise Input Shorted Unweighted | 130.5 μV | 17.5 μV |
| Dynamic Range AES17 Full Power A-Weighted | 101 dB | 118.5 dB |
| Signal to Noise Ratio Full Power A-Weighted | 105 dB | 122 dB |
| Damping Factor @ 4Ω 500 Hz* | 80 | 10000 |
| Open Load Stable | YES | YES |

*Damping Factor: $\dfrac{Z_L}{Z_{AMP} + (R_W * 2)}$

Figure 2A:
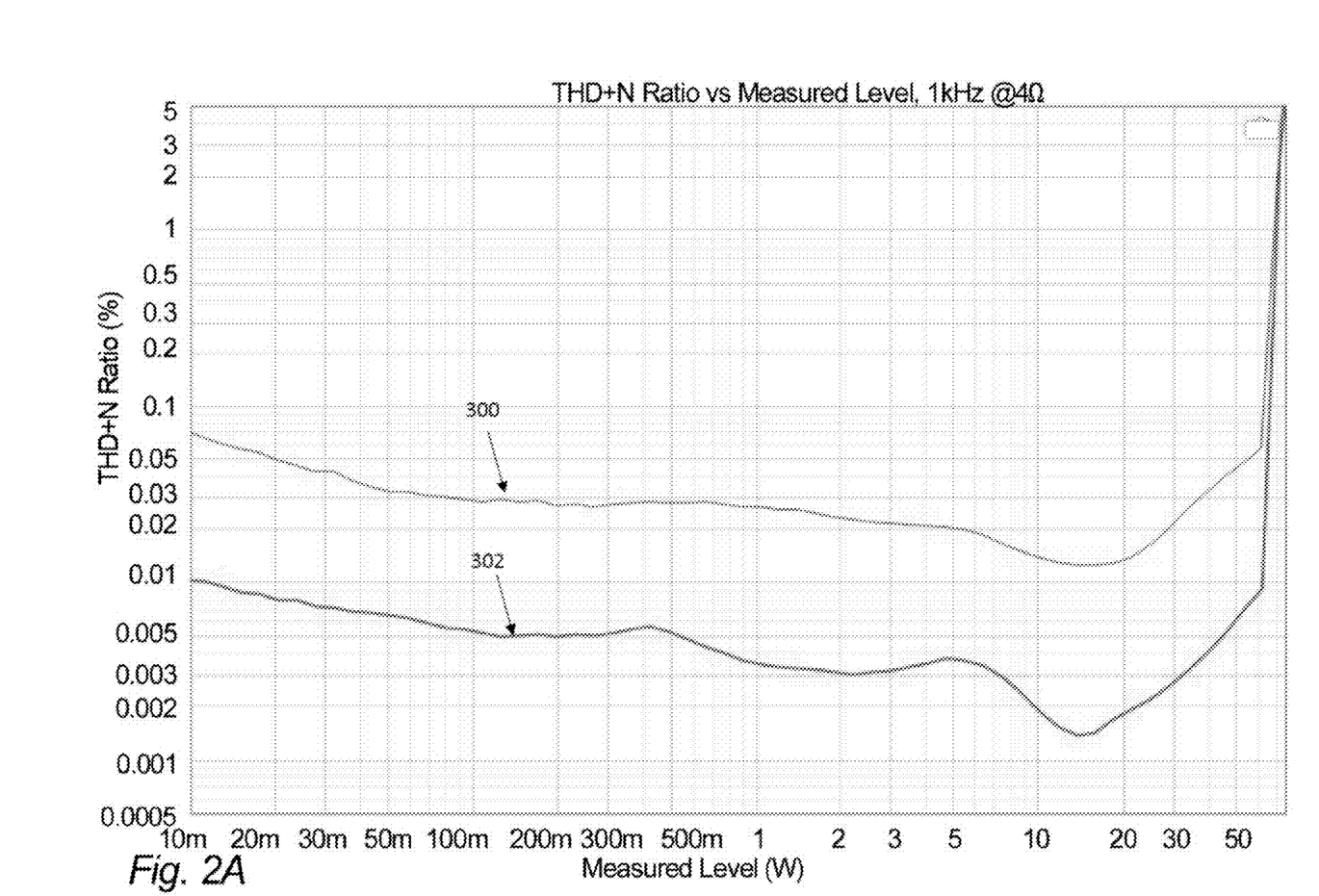
FIG. 2A illustrates a first line graph associated with a conventional amplifier and a second line graph associated with an amplifier system including a Class-D power amplifier IC that is nested inside a feedback loop of a low noise differential op-amp.

Turning to FIG. 2A, a first example line graph 300 is associated with a conventional Class-D amplifier while a second example line graph 302 is associated with an amplifier system 100 including a Class-D power amplifier IC 102 that is nested inside a feedback loop of a low noise differential op-amp 104. By nesting a Class-D amplifier IC 102 inside a feedback-loop of a differential op-amp distortions will be seen as an "error" by the differential op-amp and be corrected in opposite phase. FIG. 2A demonstrates a consistent improvement that can be seen over the conventional amplifier. The example line graphs plot the total harmonic distortion plus noise (THD+N) vs. power level (i.e., watts) at 1 kilohertz (kHz) and at 4 ohms (Ω).

Figure 2B:
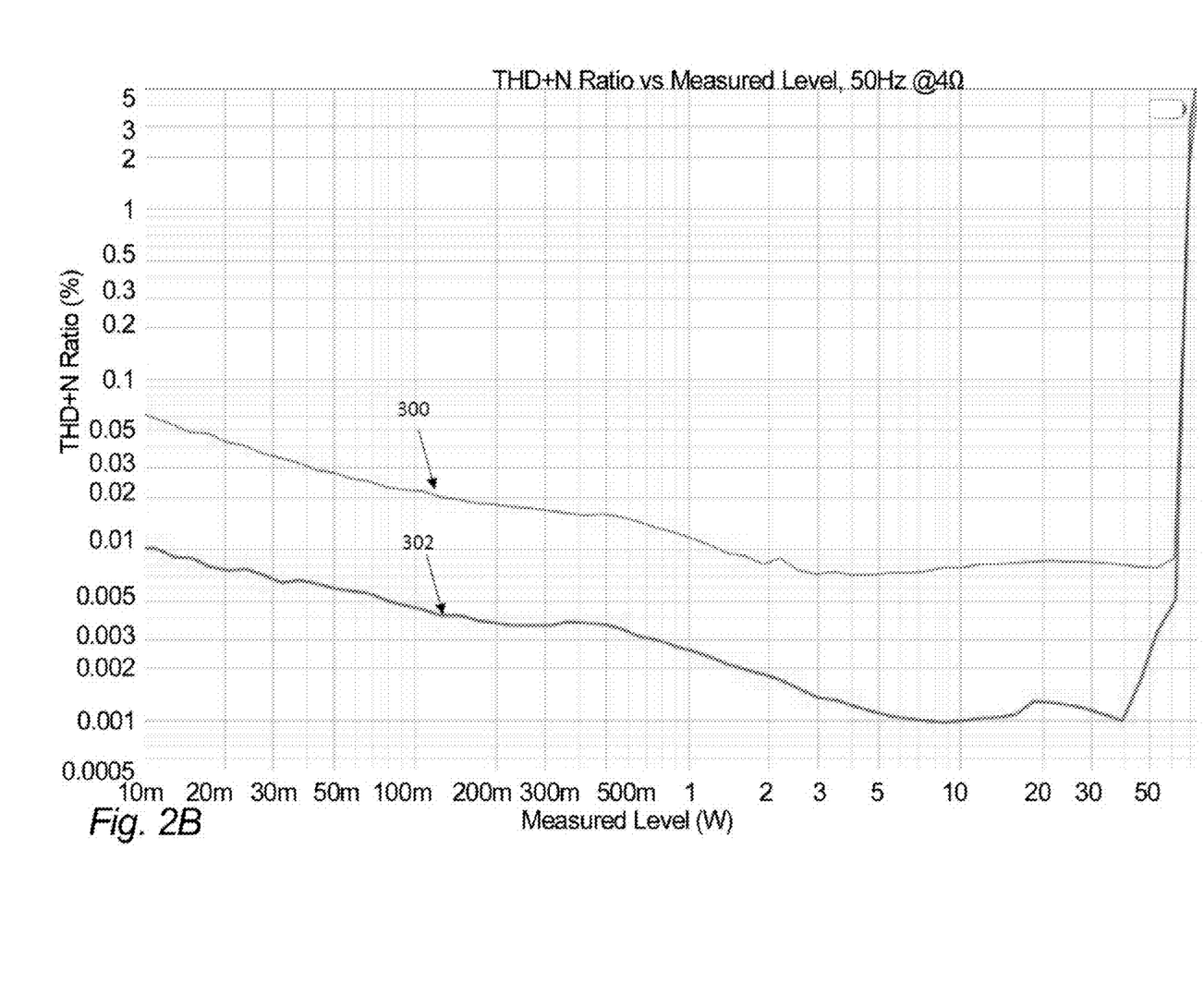
FIG. 2B illustrates a first line graph associated with a conventional amplifier and a second line graph associated with an amplifier system including a Class-D power amplifier IC that is nested inside a feedback loop of a low noise differential op-amp.

Turning to FIG. 2B, a first line graph 300 is associated with a conventional Class-D amplifier while a second line graph 302 is associated with an amplifier system 100 including a Class-D power amplifier IC 102 that is nested inside a feedback loop of a low noise differential op-amp 104. Similarly to FIG. 2A, by nesting a Class-D amplifier IC 102 inside a feedback-loop of a differential op-amp distortions will be seen as an "error" by the differential op-amp and be corrected in opposite phase. FIG. 2B demonstrates a consistent improvement that can be seen over the conventional amplifier. The example line graphs plot the total harmonic distortion plus noise (THD+N) vs. power level (i.e., watts) at 50 Hertz (Hz) and at 4 ohms (Ω).

Figure 3A:
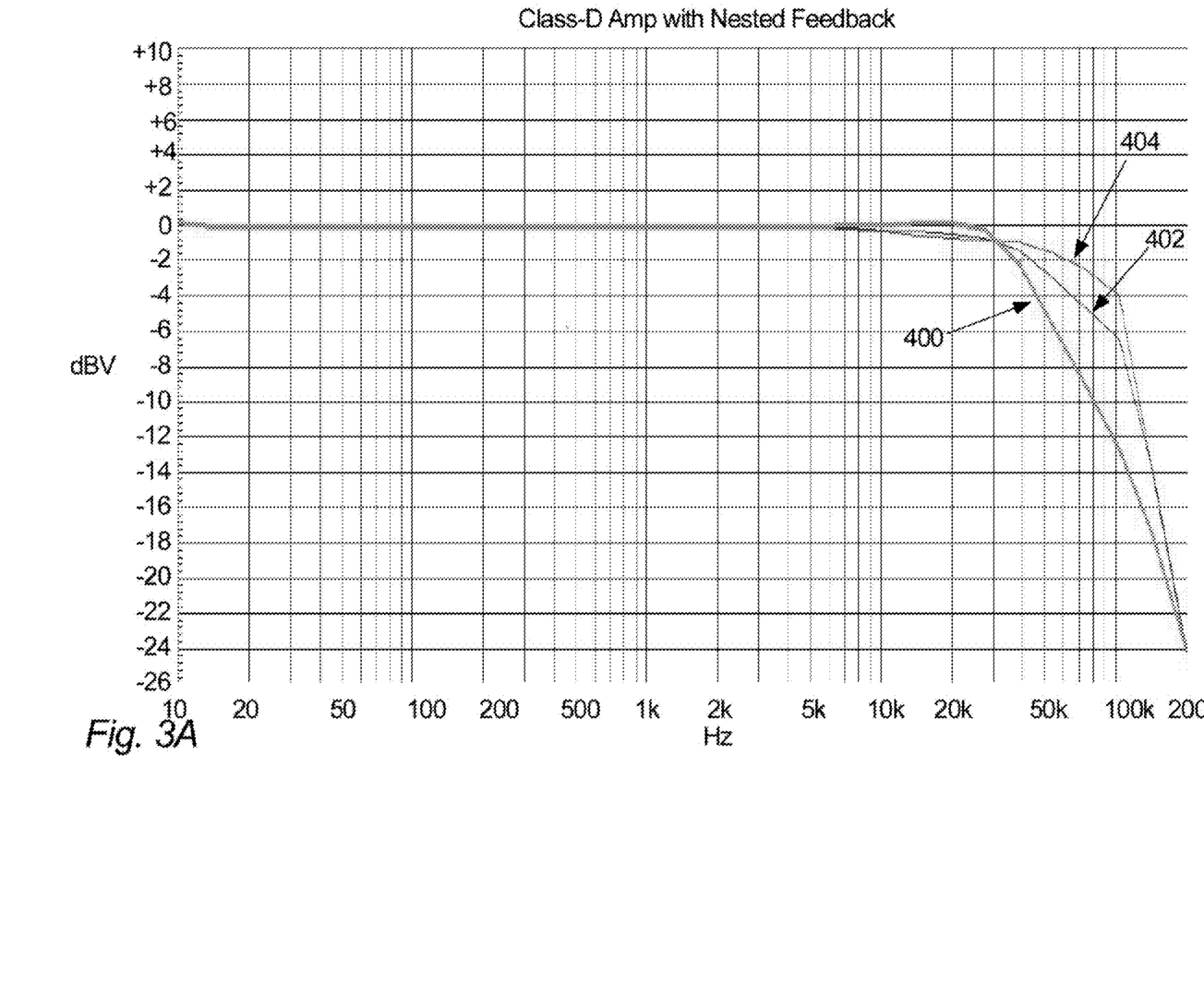
FIG. 3A is a line graph plots a frequency response vs. load of an amplifier system including an amplifier IC that is nested inside a feedback loop of a low noise differential op-amp.
Figure 3B:
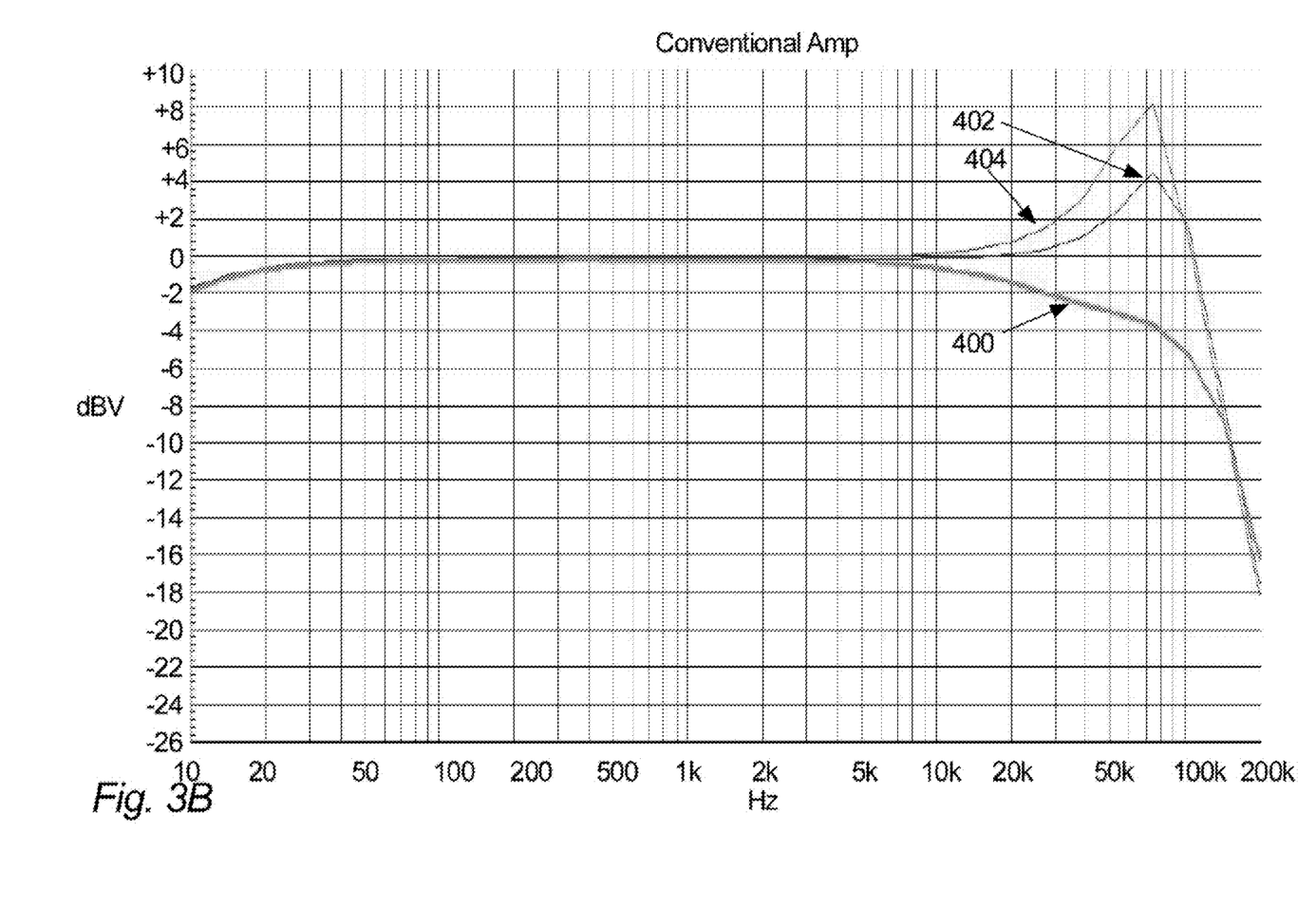
FIG. 3B is a line graph plots a frequency response vs. load of a conventional amplifier.

In FIG. 3A, an example line graph plots a frequency response vs. load of an amplifier system 100 including an amplifier IC 102 that is nested inside a feedback loop of a low noise differential op-amp 104 at 2Ω (400), at 4Ω (402), and at 8Ω (404). Turning to FIG. 3B, an example line graph plots a frequency response vs. load of a conventional Class-D amplifier at 2Ω (400), at 4Ω (402), and at 8Ω (404) to show the difference. Comparing FIG. 3A and FIG. 3B reveals that the amplifier system with amplifier IC 102 nested inside a feedback loop of a low noise differential op-amp according to an embodiment of the invention, improves the high frequency response compared to the conventional Class-D amplifier.

FIGS. 4A-4D are example Fast-Fourier transform (FFT) analyses of different input tones applied to a conventional Class-D amplifier represented by graph 500 and an amplifier system 100 including an amplifier IC 102 that is nested inside a feedback loop of a low noise differential op-amp 104 according to an embodiment of the invention, represented by graph 502.

Figure 4A:
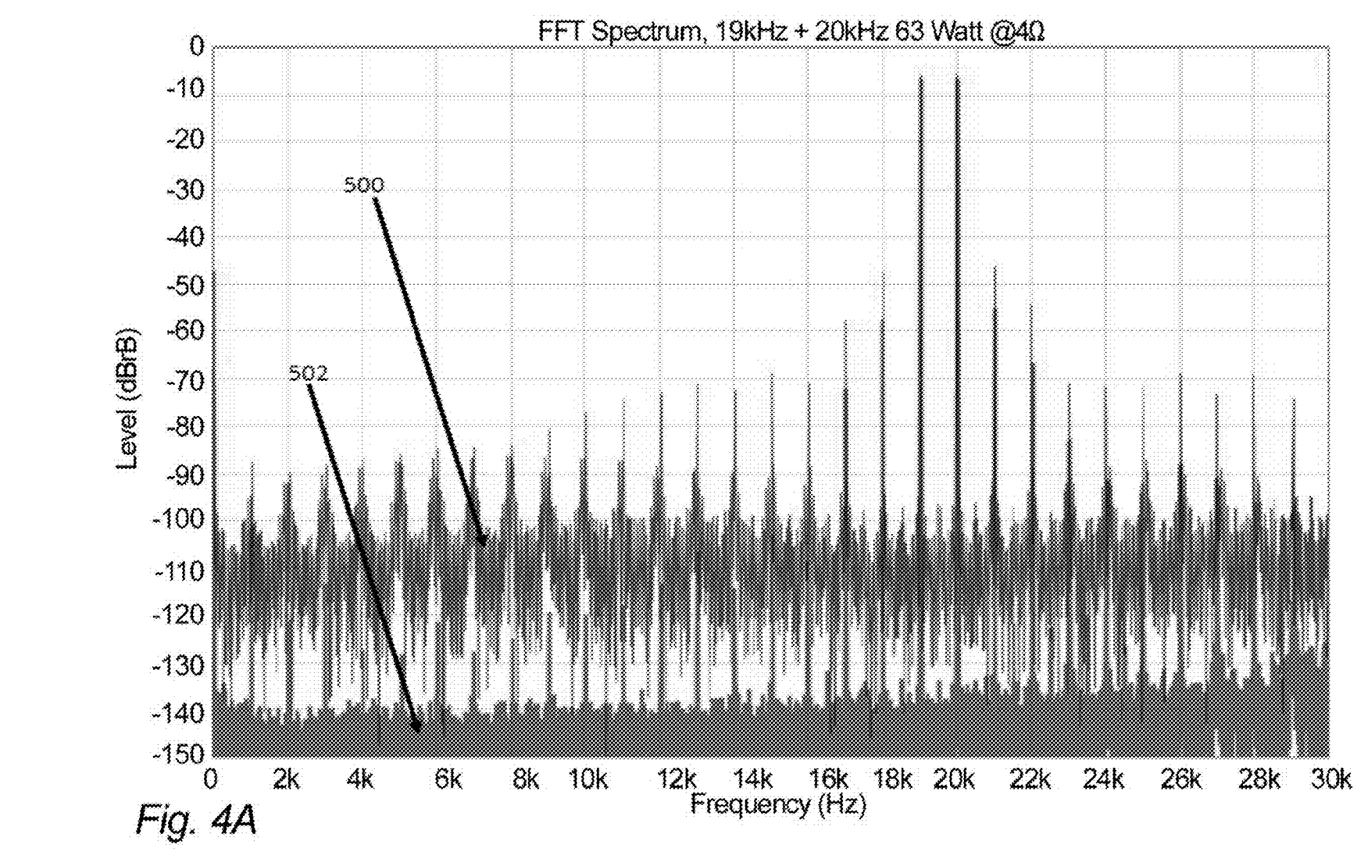
FIG. 4A is graph illustrating a Fast-Fourier transform (FFT) analysis of a conventional amplifier and an amplifier system including an amplifier IC that is nested inside a feedback loop of a low noise differential op-amp.
Figure 4B:
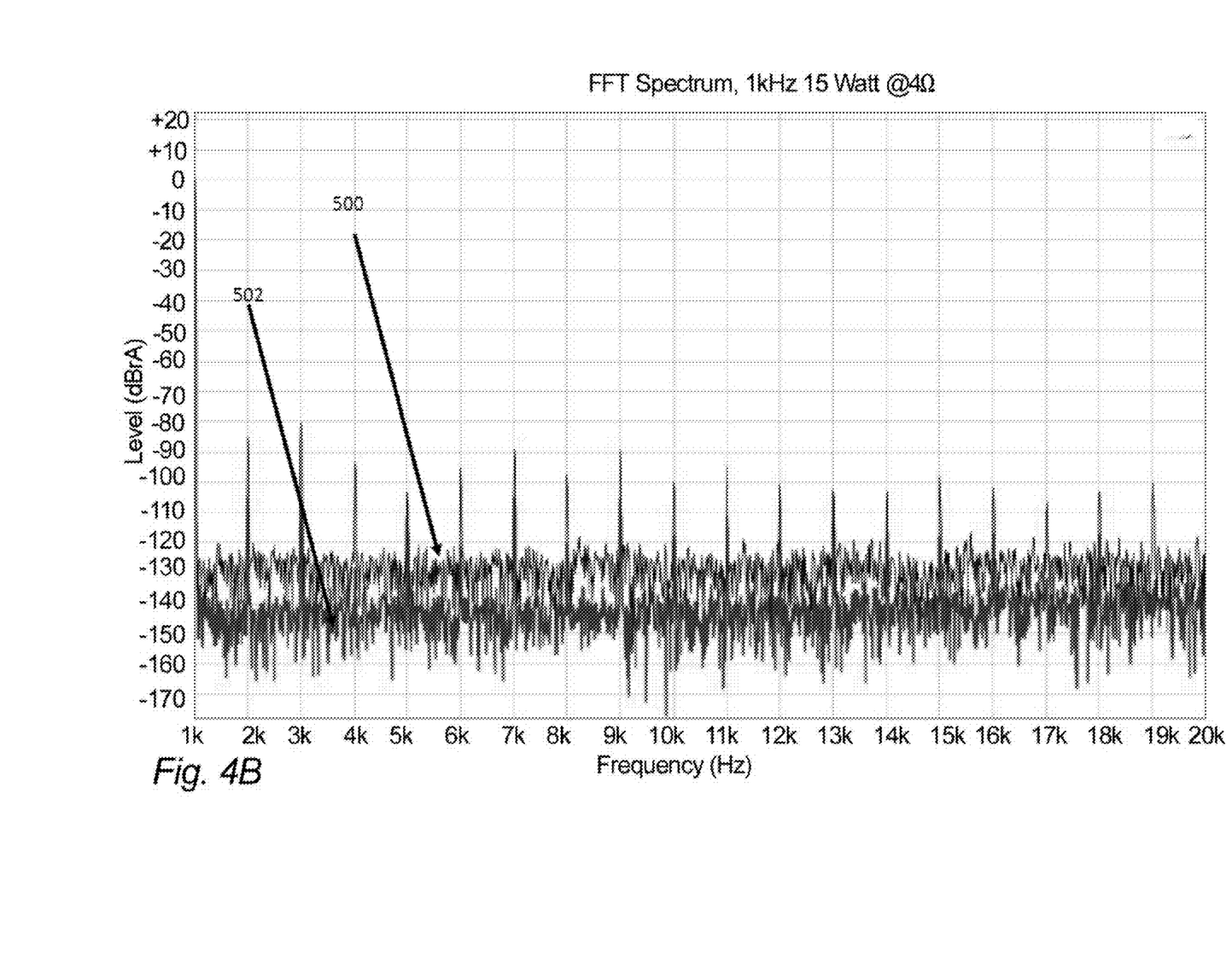
FIG. 4B is another graph illustrating a Fast-Fourier transform (FFT) analysis of a conventional amplifier and an amplifier system including an amplifier IC that is nested inside a feedback loop of a low noise differential op-amp.
Figure 4C:
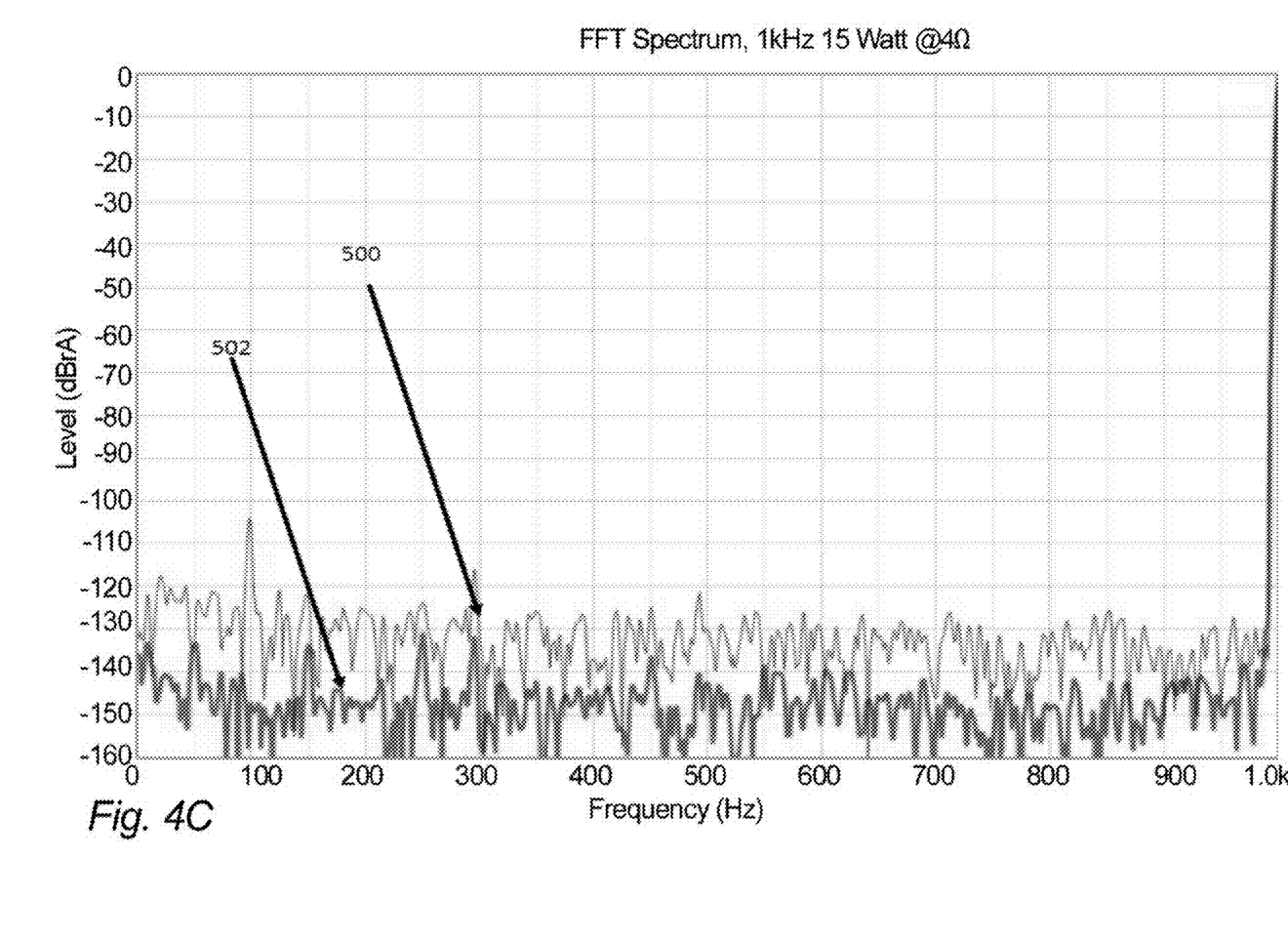
FIG. 4C is another graph illustrating a Fast-Fourier transform (FFT) analysis of a conventional amplifier and an amplifier system including an amplifier IC that is nested inside a feedback loop of a low noise differential op-amp.
Figure 4D:
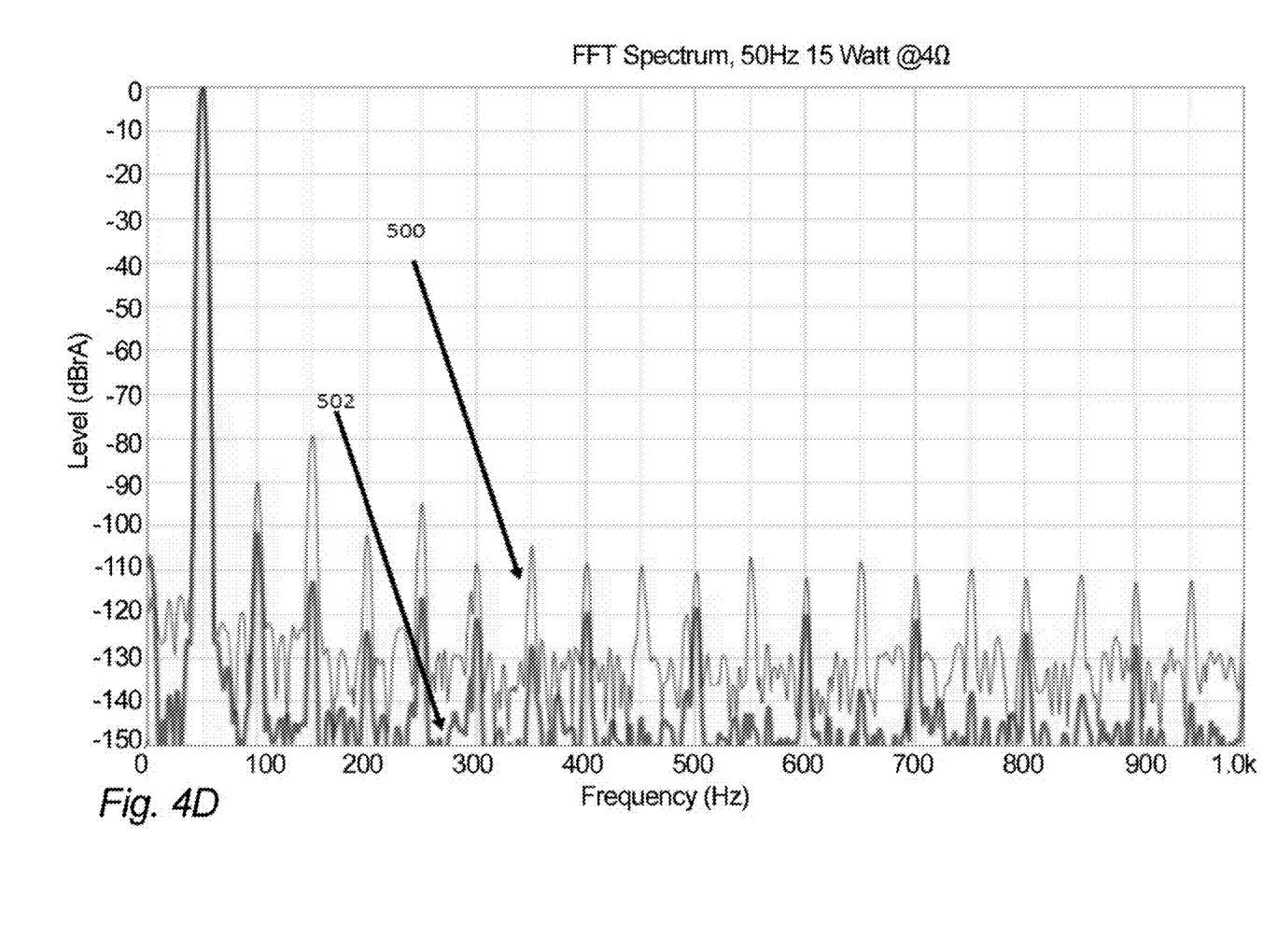
FIG. 4D is another graph illustrating a Fast-Fourier transform (FFT) analysis of a conventional amplifier and an amplifier system including an amplifier IC that is nested inside a feedback loop of a low noise differential op-amp.

FIG. 4A illustrates the FFT analysis for a signal at 19 kHz+20 kHz, 63 W at 4Ω. FIGS. 4B and 4C illustrate the FFT analysis for a signal at 1 kHz, 15 W at 4Ω, where FIG. 4B illustrates the upper spectrum above 1 kHz, and FIG. 4C illustrates the lower spectrum below 1 kHz. FIG. 4D illustrates the FFT analysis for a signal at 50 Hz, 15 W at 4Ω.

As can be seen in all the experiment results of FIGS. 4A-4D, both the suppression of harmonics and of general noise is improved in the embodiment of the invention represented by graph 502, as compared to the performance of a conventional amplifier shown by graph 500.

Figure 5:
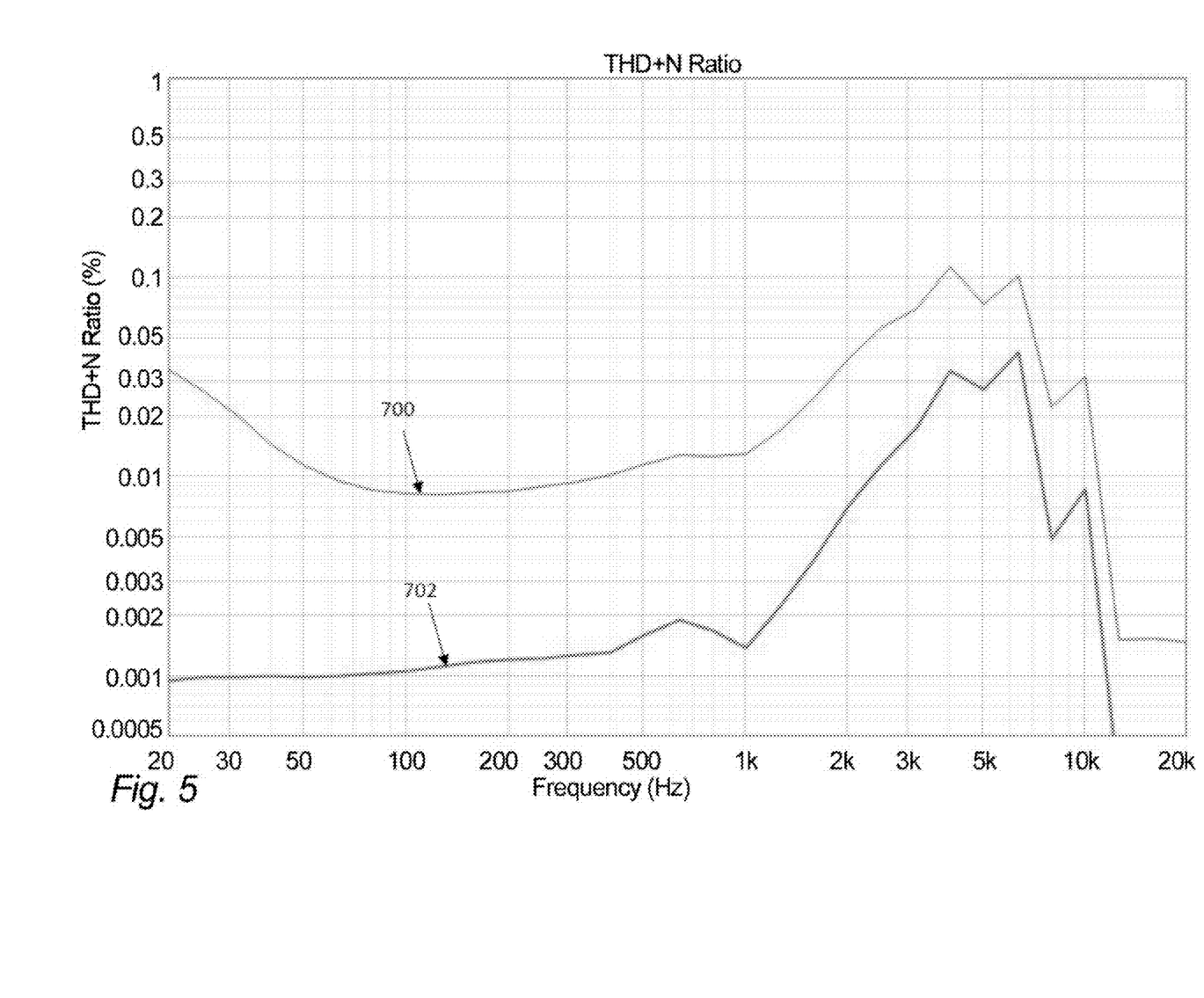
FIG. 5 illustrates a first line graph associated with a conventional amplifier and a second line graph associated with an amplifier system including a Class-D power amplifier IC that is nested inside a feedback loop of a low noise differential op-amp.

Referring to FIG. 5, an example first line graph 700 is associated with a conventional amplifier while an example second line graph 702 is associated with an amplifier system 100 including a Class-D power amplifier IC 102 that is nested inside a feedback loop of a low noise differential op-amp 104. The line graphs plot the ratio of total harmonic distortion plus noise (THD+N) vs. frequency at 15 Watts (W) and 4 ohms (Ω). This plot also confirms the improvement of suppression of THD and noise in an embodiment of the invention, compared with a conventional amplifier.

Figure 6:
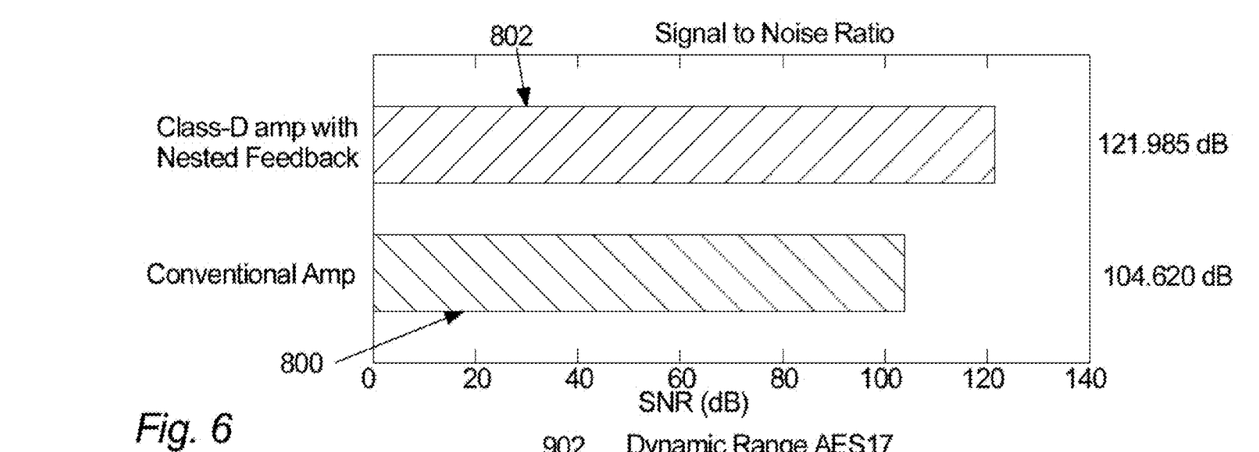
FIG. 6 illustrates a signal-to-noise (S/N) ratio graph of a conventional amplifier and a signal-to-noise (S/N) ratio graph of an amplifier system including an amplifier IC that is nested inside a feedback loop of a low noise differential op-amp.

FIG. 6 illustrates an example signal-to-noise (S/N) ratio graph 800 of a conventional amplifier and a signal-to-noise (S/N) ratio graph 802 of an amplifier system 100 including an amplifier IC 102 that is nested inside a feedback loop of a low noise differential op-amp 104. As seen, the S/N ratio is more than 17 dB better in the amplifier embodiment with nested feedback.

Figure 7:
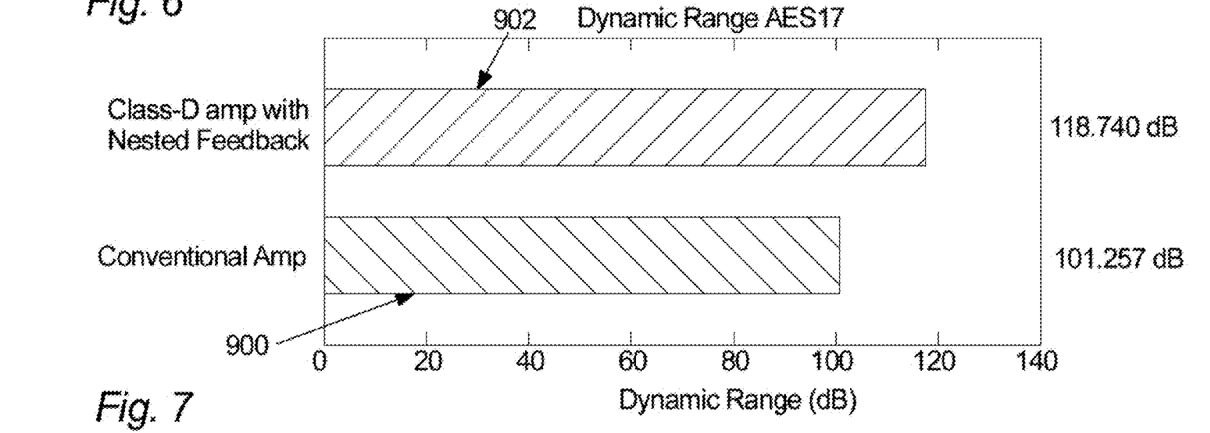
FIG. 7 illustrates a dynamic range graph of a conventional amplifier and a dynamic range graph of an amplifier system including an amplifier IC that is nested inside a feedback loop of a low noise differential op-amp.

FIG. 7 illustrates an example dynamic range graph 900 of a conventional amplifier and a dynamic range graph 902 of an amplifier system 100 including an amplifier IC 102 that is nested inside a feedback loop of a low noise differential op-amp 104. The AES17 dynamic range of the amplifier embodiment with nested feedback is also improved by more than 17 dB.

Figure 8:
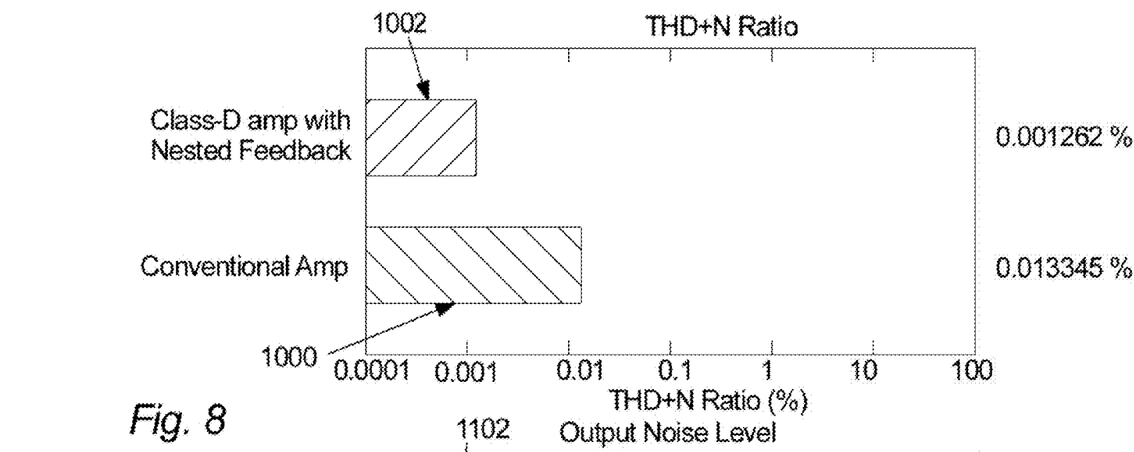
FIG. 8 illustrates a total harmonic distortion plus noise (THD+N) graph of a conventional amplifier and a THD+N graph of an amplifier system including an amplifier IC that is nested inside a feedback loop of a low noise differential op-amp.

FIG. 8 illustrates an example total harmonic distortion plus noise (THD+N) ratio graph 1000 of a conventional amplifier and a THD+N ratio graph 1002 of an amplifier system 100 including an amplifier IC 102 that is nested inside a feedback loop of a low noise differential op-amp 104. The THD+N ratio is measured at 1 kHz, and as illustrated, the ratio is improved by more than a factor 10.

Figure 9:
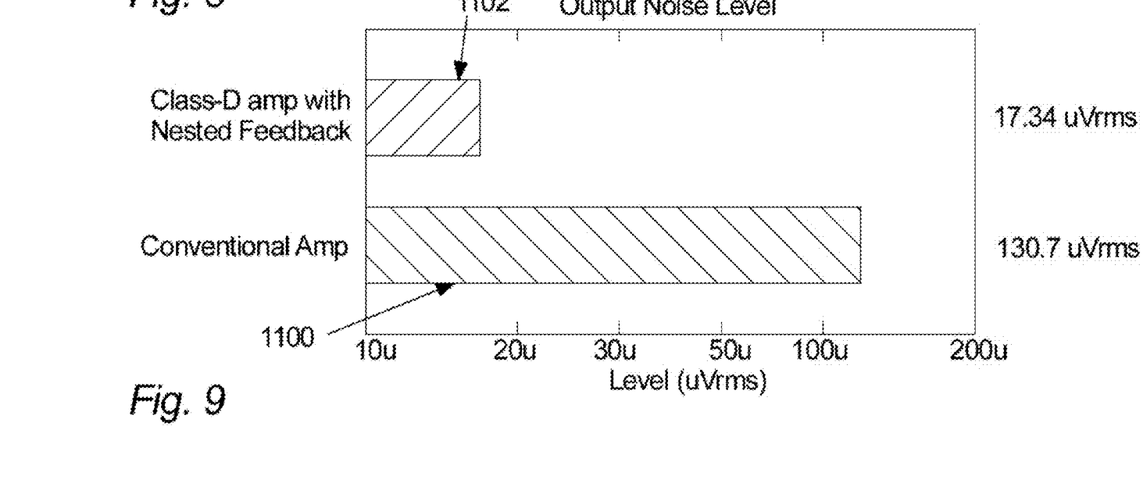
FIG. 9 illustrates an output noise graph of a conventional amplifier and an output noise graph of an amplifier system including an amplifier IC that is nested inside a feedback loop of a low noise differential op-amp.

FIG. 9 illustrates an example output noise graph 1100 of a conventional amplifier and an output noise graph 1102 of an amplifier system 100 including an amplifier IC 102 that is nested inside a feedback loop of a low noise differential op-amp 104. The conventional amplifier produces more than 7 times the level of noise with the input shorted, compared to the embodiment with nested feedback of the present invention.

Figure 10:
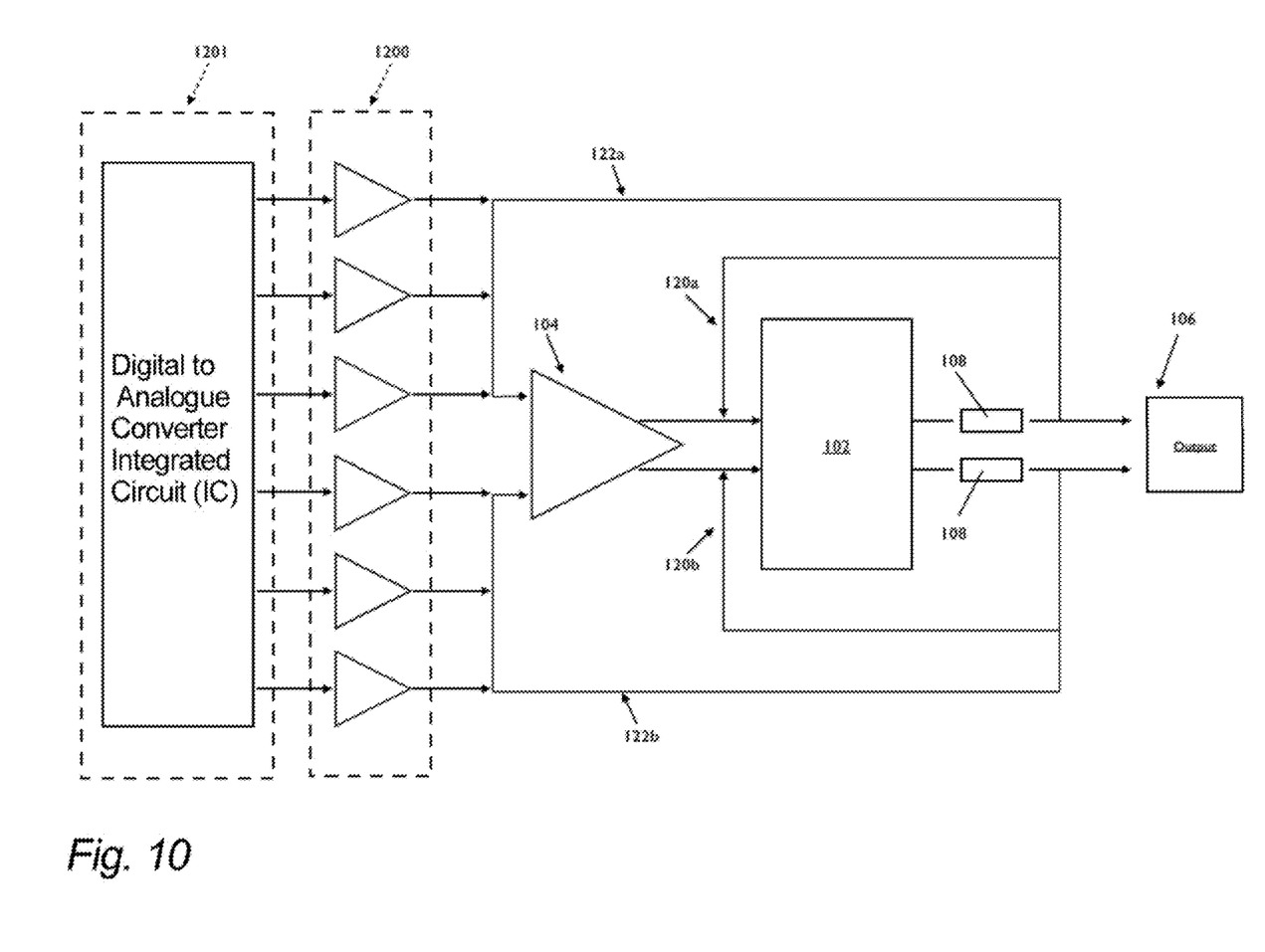
FIG. 10 is a block diagram of another example amplifier system including a Class-D power amplifier integrated circuit (IC) that is nested inside a feedback loop of a low noise differential operational amplifier (op-amp) according to a non-limiting example.

FIG. 10 illustrates an example alternative configuration of an embodiment of the invention where an amplifier IC 102 may be nested inside the feedback loop of a low-noise differential operational amplifier 104 driven by a digital to analogue converter IC 1201. A number of the features seen in FIG. 10 have already been described in reference to FIG. 1 and thus repeat description of these will be omitted.

Additionally, the digital to analogue converter IC 1201 can be utilized in the amplifier system of FIG. 1 as well as FIG. 10. This digital to analogue converter IC 1201 may be a multichannel digital to analogue converter IC 1201.

Multiple operational amplifier IC's 1200 can be used in parallel to drive the impedance of differential operational amplifier 104. Multiple operational amplifier IC's 1200 may also be used/connected in the input stage to further reduce noise because of their ability when combined in parallel to deliver a high current to drive the low-impedance input, e.g. in an embodiment around 100Ω, of differential operational amplifier 104 achieved by low-resistance feedback loops reducing noise. As shown in FIG. 10, the multiple operational amplifier ICs 1200 may be provided at the input stage prior to the differential operational amplifier 104 and nested feedback loops. In another embodiment, the multiple operational amplifiers 1200 may be swapped as a front end drive stage and moved to be placed between the power amplifier IC 102 and the output 106.

Each digital to analogue converter output 1201 can have its own operational amplifier. Operational amplifiers 1201 are voltage summed at the input nodes of differential operational amplifier 104.

Parallel operational amplifiers 1200 reduce the input noise further by 3 dB per each paralleled circuit.

Virtually any number of paralleled digital to analogue converters can be added to the circuit, as well any number of operational amplifiers.

The below Table 2 illustrates the further performance improvement over a conventional Class-D amplifier by an amplifier system including multiple operational amplifiers 1200 driving an input stage for differential operational amplifier 104 and further including a Class-D power amplifier IC that is nested inside a feedback loop of a low noise differential op-amp according to a non-limiting example. As evident from the below table, the embodiment of the invention with nested feedback shows improvements on all the listed parameters.

TABLE 2

| | Conventional 2ch Class D Amplifier | Class-D Amp w/ Nested Feedback |
|---|---|---|
| THD + N 10 Watt @ 4Ω 1 kHz | 0.035% | 0.00055% |
| Output Noise Input Shorted A-weighted RMS | 1.4 mV | 8.5 µV |
| Dynamic Range AES17 Full Power A-Weighted | 85.9 dB | 123.5 dB |
| Signal to Noise Ratio Full Power A-Weighted | 83.3 dB | 123.5 dB |
| Open Load Stable | YES | YES |

Various examples of the present invention are described herein with reference to the related drawings. Alternative example combinations can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" or "electrically coupled" can include both an indirect "connection" and a direct "connection."

The descriptions of the various examples of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An amplifier system, comprising:
   a power amplifier integrated circuit;
   a differential operational amplifier; and
   a current drive circuit,
   wherein the power amplifier integrated circuit is nested within at least one feedback loop of the differential operational amplifier, and
   wherein the current drive circuit is connected between the differential operational amplifier and an input.

2. The amplifier system of claim 1, wherein the power amplifier integrated circuit is a Class-D power amplifier integrated circuit.

3. The amplifier system claim 1, wherein the power amplifier integrated circuit is connected to an output.

4. The amplifier system of claim 3, wherein the connection to the output is via at least one inductor.

5. The amplifier system of claim 1, wherein the at least one feedback loop includes at least one first feedback loop with at least one first connection electrically coupled to at least one output of the power amplifier integrated circuit and at least one second connection electrically coupled to at least one output of the differential operational amplifier.

6. The amplifier system of claim 1, wherein the at least one feedback loop includes at least one second feedback loop with at least one first connection electrically coupled to at least one output of the power amplifier integrated circuit and at least one second connection electrically coupled to at least one input of the differential operational amplifier.

7. The amplifier system of claim 1, wherein the current drive circuit further comprises at least one amplifier stage.

8. The amplifier system of claim 7, wherein the current drive circuit comprises a first amplifier stage connected directly or indirectly to a second amplifier stage.

9. The amplifier system of claim 7, wherein at least one stage of the current drive circuit is connected between an input and the differential operational amplifier.

10. An amplifier system, comprising:
    a power amplifier integrated circuit;

a differential operational amplifier; and
a current drive circuit,
wherein the power amplifier integrated circuit is nested within at least one feedback loop of the differential operational amplifier, and
wherein the current drive circuit further includes at least one feedback circuit.

11. The amplifier system of claim 10, wherein the at least one feedback circuit includes at least one first connection electrically coupled to at least one output of the second amplifier stage and at least one second connection electrically coupled to at least one input of the first amplifier stage.

12. The amplifier system of claim 7, wherein the at least one amplifier stage is an operational amplifier stage, preferably the first amplifier stage.

13. The amplifier system of claim 7, wherein the at least one amplifier stage is a diamond buffer stage, preferably the second amplifier stage.

14. An amplifier system, comprising:
a power amplifier integrated circuit; and
a differential operational amplifier,
wherein the power amplifier integrated circuit is nested within at least one feedback loop of the differential operational amplifier, and
wherein the one or more feedback loops of the differential operational amplifier are driven by a digital to analogue converter integrated circuit.

15. The amplifier system of claim 14, wherein the digital to analogue converter integrated circuit is multichannel.

16. The amplifier system of claim 1, wherein at least one operational amplifier integrated circuit is used in an input stage to further reduce noise.

* * * * *